United States Patent
Pröll et al.

(10) Patent No.: US 6,859,406 B2
(45) Date of Patent: Feb. 22, 2005

(54) DYNAMIC RAM SEMICONDUCTOR MEMORY AND METHOD FOR OPERATING THE MEMORY

(75) Inventors: Manfred Pröll, Dorfen (DE); Stephan Schröder, München (DE); Claus Engelhardt, München (DE); Jörg Kliewer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/724,906

(22) Filed: Dec. 1, 2003

(65) Prior Publication Data

US 2004/0109343 A1 Jun. 10, 2004

(30) Foreign Application Priority Data

Nov. 29, 2002 (DE) .......................... 102 55 867

(51) Int. Cl.$^7$ ................................. G11C 7/00
(52) U.S. Cl. .................... 365/205; 365/230.03
(58) Field of Search ................ 365/205, 207, 365/230.03, 230.04, 149

(56) References Cited

U.S. PATENT DOCUMENTS

| | | | | |
|---|---|---|---|---|
| 5,671,188 A | * | 9/1997 | Patel et al. ................ | 365/205 |
| 5,740,120 A | * | 4/1998 | Okamura ................ | 365/230.03 |
| 5,798,975 A | | 8/1998 | Büttner et al. | |
| 6,469,951 B2 | * | 10/2002 | Toda ...................... | 365/230.03 |
| 2002/0067653 A1 | | 6/2002 | Toda | |

FOREIGN PATENT DOCUMENTS

DE   196 32 780 A1   2/1998

* cited by examiner

Primary Examiner—Gene N. Auduong
(74) Attorney, Agent, or Firm—Laurence A. Greenberg; Werner H. Stemer; Ralph E. Locher

(57) ABSTRACT

A dynamic RAM semiconductor memory with a shared sense amplifier organization concept, in which the cell arrays are subdivided into blocks whose bit lines are connected in pairs from two adjacent blocks in each case to a common sense amplifier and the sense amplifiers are disposed between the cell blocks. In which case bit line switches are disposed in sense amplifier strips—lying between the blocks—between in each case two adjacent sense amplifiers in order to momentarily connect the other ends—not connected to the sense amplifiers—of two bit line pairs from the adjacent cell blocks during a precharge phase of a bit line pair activated directly beforehand. The precharge phase takes place at the start of a charge equalization phase.

6 Claims, 3 Drawing Sheets

DYNAMIC RAM SEMICONDUCTOR MEMORY AND METHOD FOR OPERATING THE MEMORY

BACKGROUND OF THE INVENTION

Field of the Invention

The invention relates to a dynamic random access memory (DRAM) with a shared sense amplifier organization concept, in which the cell arrays are subdivided into blocks and whose bit lines are connected in pairs from two adjacent blocks in each case to a common sense amplifier and the sense amplifiers are disposed between the cell blocks. The invention further relates to a method for operating the memory.

In DRAM modules, so-called sense amplifiers are used to evaluate the signals on the bit lines.

The accompanying FIG. 1A diagrammatically shows a so-called shared sense amplifier (SA) organization concept of a dynamic RAM semiconductor memory, in which the cell arrays are subdivided into blocks 1, 2. Each cell block 1, 2 contains 4 megabits of memory cells, for example. The form of organization of the dynamic RAM semiconductor memory illustrated in FIG. 1A is referred to as a "shared SA organization concept" since, in the case of the latter, as shown, the sense amplifiers SA for evaluating the bit line signals from a left-hand and right-hand block 1, 2 are connected in each case on the left and on the right to a bit line pair BLT, BLC carrying complementary signals. In SA strips in each case between the cell blocks, the shared SA organization concept results in an area-optimized sense amplifier pattern in which the sense amplifiers SA have half the repetition rate relative to the bit line pairs.

FIG. 1A shows that the bit line pairs BLT, BLC run in a row or X direction and word lines WL run in a column or Y direction. Bit line charge equalization signal lines BL-EQL1, BL-EQL2 are disposed in the SA strip likewise in the column direction. A charge equalization unit 5, as is illustrated in detail in FIG. 1B, is situated on the right and on the left of the sense amplifier SA for each bit line pair BLT, BLC and essentially contains an N-channel transistor 3, which short-circuits the two halves BLT, BLC of a bit line pair in a charge equalization phase in order to distribute the charge of the two bit line halves (BLT, BLC) that are spread during the active phase in such a way that each bit line half is at the same center level VBleq. In order to assist this, the bit line halves BLT, BLC that are short-circuited in this way during the charge equalization phase are fed a voltage potential VBleq with the center level by a second transistor 4 provided in the charge equalization unit 5. The second transistor 4 thus connects the charge equalization unit 5 to a generator supplying the center level VBleq.

As a result of the short-circuiting of the bit line halves BLT, BLC and the associated charge equalization of the bit line capacitances via the finite resistance of the short-circuiting transistor 3 of the charge equalization unit 5, it takes a certain time to achieve the desired center level VBleq on the bit line halves BLT, BLC. This is the so-called precharge time, which specifies a time duration after which, at the earliest, a renewed word line activation command which relates to the same block and affects the same bit line is permitted to be passed to the memory module.

If a word line WL in the region of a block, for example block 1, is activated, then the adjacent region, for example block 2, and likewise the block to the left of block 1 is in the precharge state in a defined manner. Therefore, the bit line pairs of the blocks have already been short-circuited. The short-circuit of the bit line halves BLT, BLC remains active in the charge equalization phase relating to the current block 1. If the word line WL is then turned off and the bit lines in the block 1 start with the charge equalization as a result of the short-circuiting of the bit line pairs BLT, BLC, a renewed word line activation can lead to a critical precharge time only in the block 1, since there the bit lines BLT and BLC are still occupied with the charge equalization.

The accompanying FIG. 3A shows a diagrammatic signal timing diagram, on the basis of which the above conditions will be illustrated. It should be noted that the sequence represented in FIG. 3A is identical for any desired bit line pair in each cell block. The starting point in FIG. 3A is a first charge equalization phase, BL-EQL phase for short, at the end of which the bit line pair has the desired center voltage VBleq=VBLH/2. This is followed by activation by a voltage on the word line WL. During the active phase, the potentials are spread on the halves BLT and BLC of the bit line pair in order that an information item stored in the memory cells to which the bit line pair is connected can be read or an information item can be written to the memory cells. It goes without saying that the charge equalization unit 5 shown in FIG. 1B is deactivated during the active phase; no short circuit prevails between the halves BLT and BLC of the bit line pair. The active phase is followed by a second charge equalization phase, the second BL-EQL phase for short. The profile—illustrated in the circle in FIG. 3A—of the voltage and thus of the charges on the bit line halves BLT and BLC in the precharge phase that takes place at the beginning of the second bit line charge equalization phase, that is to say while BLT and BLC are short-circuited by the charge equalization unit 5, clearly shows the profile caused by the unavoidable bit line capacitances. If a renewed activation of the word line took place at this time when the bit line halves BLT and BLC have not yet assumed the same center level VBleq in a defined manner, an information item to be read or rewritten would probably be corrupted.

It should be mentioned here that the voltage profile at the beginning of the second BL-EQL phase that is depicted by dashed lines in FIG. 3A does not belong to the prior art, but instead represents a state according to this invention.

SUMMARY OF THE INVENTION

It is accordingly an object of the invention to provide a dynamic RAM semiconductor memory and a method for operating the memory that overcome the above-mentioned disadvantages of the prior art devices and methods of this general type, in which the charge time can be shortened and the above-described problem at the beginning of the charge equalization phase of the bit lines can thus be avoided.

With the foregoing and other objects in view there is provided, in accordance with the invention, a dynamic random access memory (DRAM) having a shared sense amplifier organization concept. The memory contains sense amplifiers disposed in sense amplifier strips, and cell arrays subdivided into cell blocks having memory cells and bit lines connected as bit line pairs from two adjacent cell blocks in each case to a common sense amplifier of the sense amplifiers. The sense amplifiers are disposed between the cell blocks, and the bit lines have first ends and second ends connected to the sense amplifiers. Bit line switches are disposed in the sense amplifier strips, disposed between the cell blocks, between in each case two adjacent sense amplifiers. The bit line switches momentarily connect the first ends, not connected to the sense amplifiers, of two of the bit line pairs from adjacent cell blocks during a precharge phase of a bit line pair activated directly beforehand. The precharge phase takes place at a start of a charge equalization phase.

In accordance with a first aspect of the invention, the dynamic RAM with a shared SA organization concept is distinguished by the fact that bit line switches are disposed in sense amplifier strips, lying between the blocks, between in each case two adjacent sense amplifiers in order to momentarily connect the other ends, not connected to the sense amplifiers, of two bit line pairs from the adjacent cell blocks during the precharge phase of a bit line pair activated directly beforehand. The precharge phase takes place at the start of a charge equalization phase.

In accordance with a second essential aspect, a method for operating such a dynamic RAM with a shared SA organization concept is characterized in that the previously not connected other ends of those bit line pairs which are connected to the sense amplifiers lying in two adjacent sense amplifier strips are momentarily interconnected during a precharge phase for the relevant bit line pair, the precharge phase taking place at the start of a charge equalization phase, and the precharge time for the relevant bit line pair is thereby shortened.

Consequently, connecting the hitherto open bit line ends by the electrical switch pair disposed in each case between two adjacent sense amplifiers in the sense amplifier strip affords a possibility of using that adjacent bit line of the adjacent block which is already stable at the center potential for accelerating the charge equalization of the bit line in the relevant block. In this case, the bit line switches are switched on only for a short time at the beginning of the charge equalization phase by a control signal and the two bit line pairs are connected to one another from the right and left during this short time. The precharge performance of the entire DRAM semiconductor memory module is thereby improved. The use of the bit line switches is not bound to specific twist concepts, but rather can always be realized, since only the bit line halves from the left and right are directly connected to one another. Furthermore, the bit line switches do not pose a problem for the individual repair of bit-line-oriented redundancy elements.

In accordance with an added feature of the invention, a multiplicity of word lines run in the cell blocks of the cell arrays, the word lines intersect the bit lines substantially perpendicularly and activate the memory cells of the cell blocks.

In accordance with a further feature of the invention, charge equalization units are each connected to one of the bit line pairs in the sense amplifier strips on a right and on a left of each of the sense amplifiers to short-circuit two bit line halves of each of the bit line pairs directly after an activation of a respective cell block to which a respective bit line pair belongs, for a charge equalization of the two bit line halves that are spread during an active phase of the respective cell block.

In accordance with an additional feature of the invention, to close each of the bit line switches, each of the bit line switches receives a control signal generated by a logical combination of charge equalization states of this and at least an adjacent cell block.

Other features which are considered as characteristic for the invention are set forth in the appended claims.

Although the invention is illustrated and described herein as embodied in a dynamic RAM semiconductor memory and a method for operating the memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

As mentioned above, the heart of the invention lies in the ends—open (not connected to each other) up to this point—of bit line pairs of two adjacent cell blocks being momentarily connected to bit lines switch pairs at the beginning of the charge equalization phase for a relevant bit line pair. The ends of the two bit line pairs that are connected to the bit line switch pair are not connected to sense amplifiers.

Figure 1A:
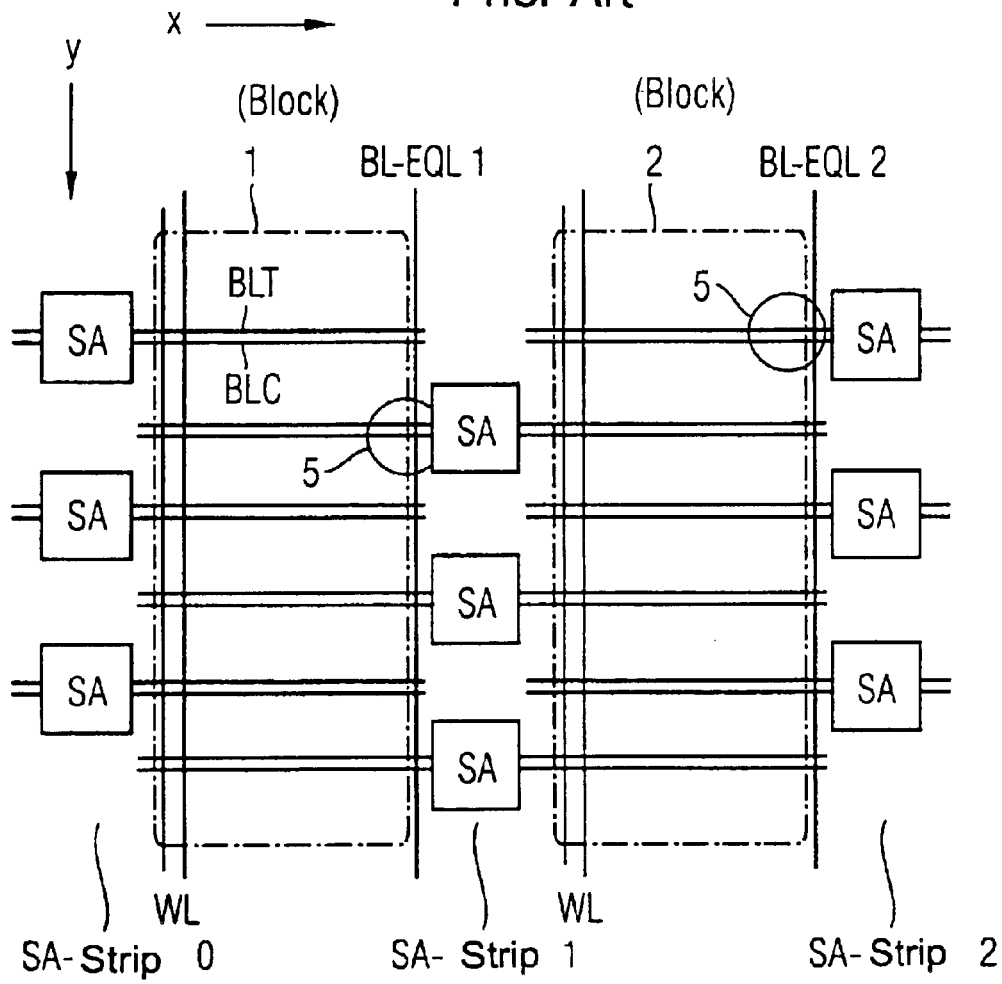
FIG. 1A is a diagrammatic illustration showing a shared sense amplifier (SA) organization concept of a known dynamic RAM semiconductor memory.
Figure 1B:
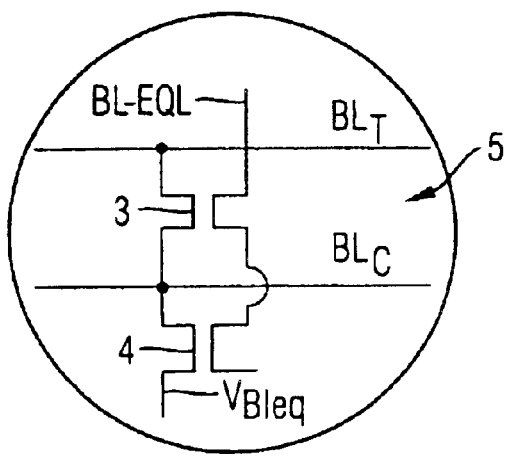
FIG. 1B is circuit diagram of a detail from FIG. 1A with a bit line charge equalization unit.
Figure 2A:
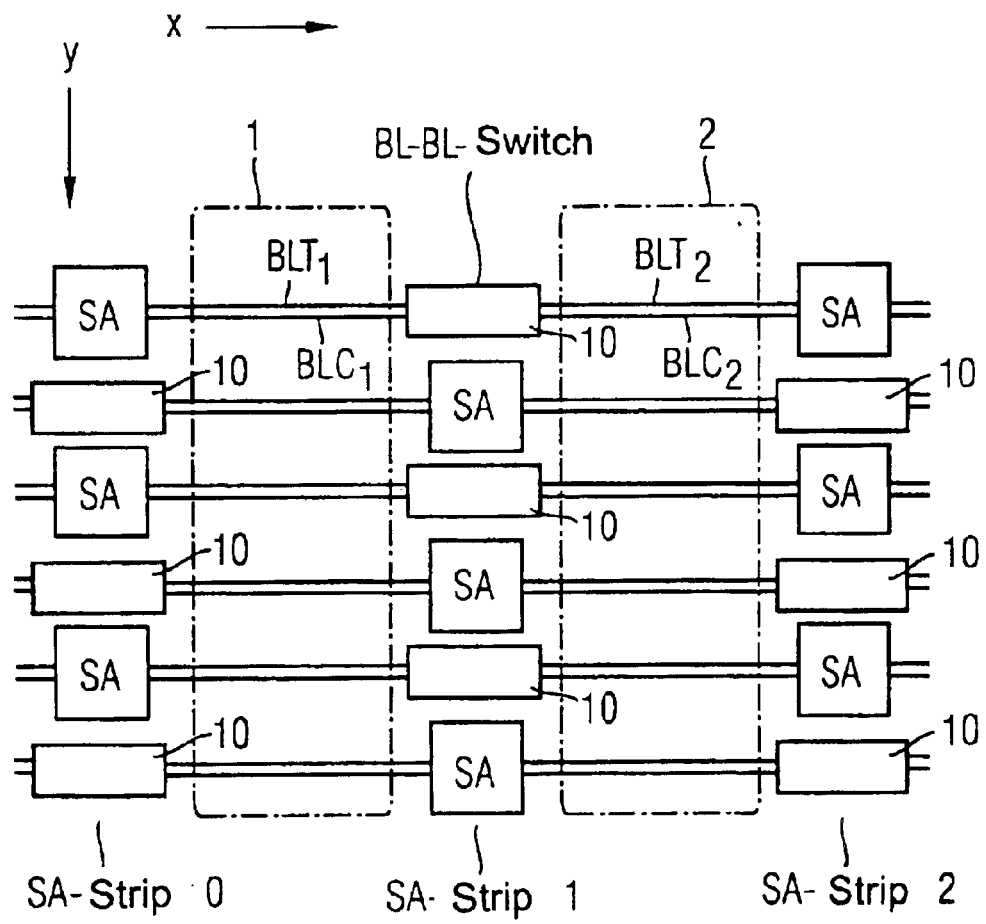
FIG. 2A is an illustration of a dynamic RAM according to the invention, likewise having a shared SA organization concept.

Referring now to the figures of the drawing in detail and first, particularly, to FIG. 2A thereof, there is shown diagrammatically likewise a shared sense amplifier (SA) organization structure as has already formed the basis for the known dynamic RAM in accordance with FIG. 1A. FIG. 2A shows that BL—BL switches 10 are disposed in the SA strips 0, 1, 2 between in each case two adjacent sense amplifiers SA.

Figure 2B:
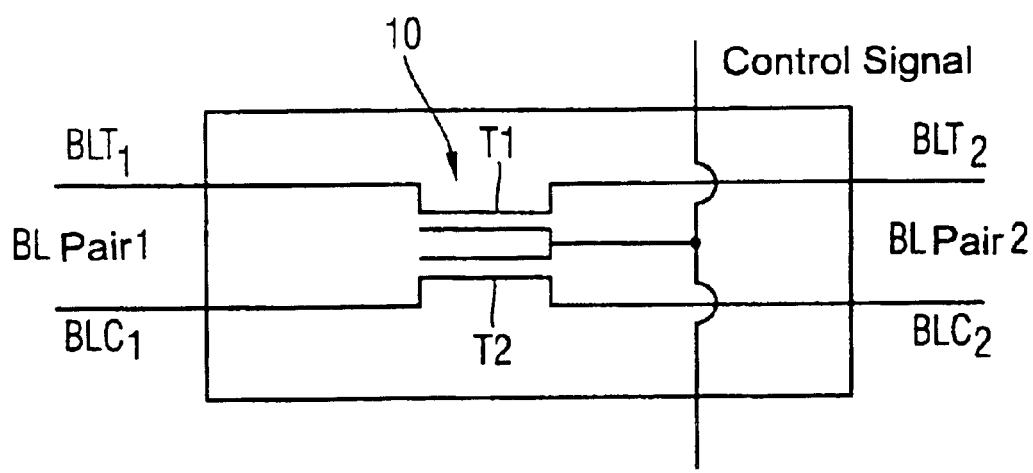
FIG. 2B is a circuit diagram of details of a BL—BL switch used in FIG. 2A.

A basic circuit of the BL—BL switch 10 is shown in FIG. 2B. In accordance with FIG. 2B, the bit line switch 10 has a first FET transistor T1 and a second FET transistor T2 of the same type, which connects the two true bit lines BLT1 and BLT2, on the one hand, and the two complementary bit lines BLC1 and BLC2, on the other hand, in each case of a bit line pair 1 (for example from a cell block 11) and of a bit line pair 2 (e.g. from a cell block 12). Therefore, rather than BLT1 being connected to BLC1 and BLT2 being connected to BLC2, instead BLT1 is connected to BLT2 and BLC1 is connected to BLC2 in each case of the left-hand BL pair 1 and of the right-hand BL pair 2.

It should be noted that neither word lines in the cell blocks 11 and 12 nor charge equalization signal lines in the sense amplifier strips are depicted in FIG. 2A, for the purpose of simplification. The control signal is applied to the bit line switch 10 shown in FIG. 2B at the beginning of a bit line charge equalization phase, for e.g. the bit line pair 1, that is to say for BLT1 and BLC1, in order to shorten the precharge time for these bit lines.

Figure 3A:
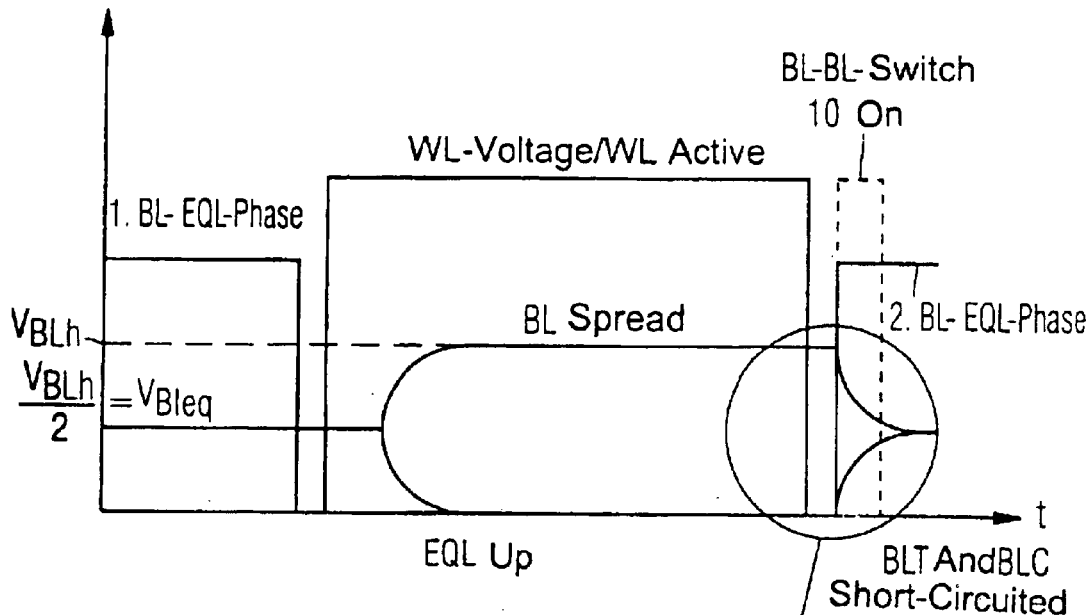
FIG. 3A is a graph showing voltage profiles in the cell blocks in particular at the bit line pairs.
Figure 3B:
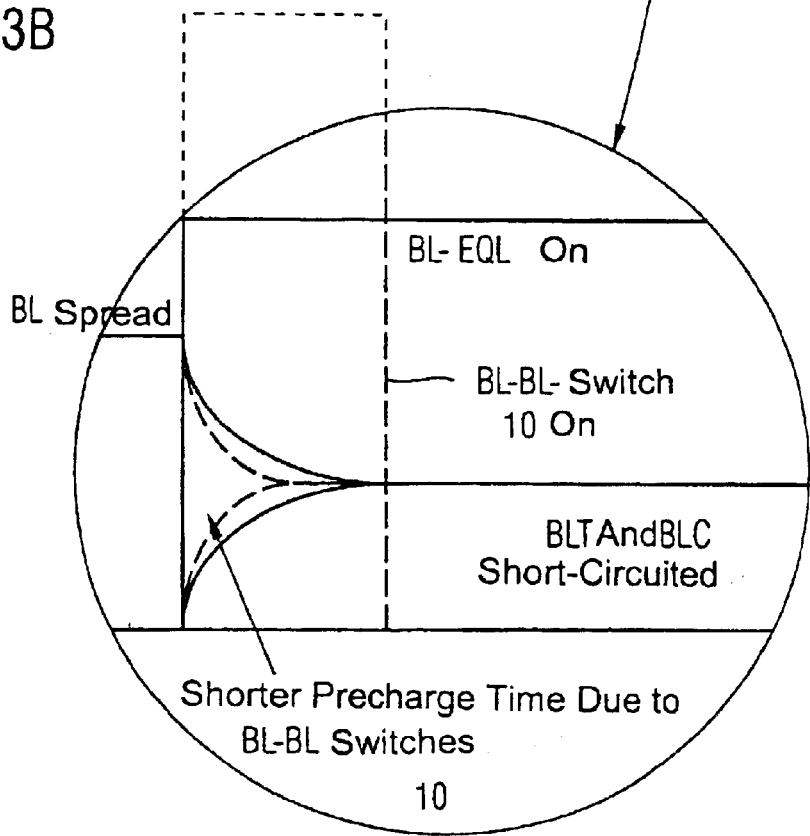
FIG. 3B is a graph showing voltage profiles for illustrating the interconnection of the hitherto open ends of the bit line pairs according to the present invention.

FIG. 3A uses dashed lines to show the temporal position of the control signal that is fed to the bit line switch 10 and is designated by BL—BL switch 10. It is clear that the control signal lies directly at the beginning of the bit line charge equalization phase or BL-EQL phase. The control signal can thus be generated in a simple manner by a logical combination of the conditions for the BL-EQL phase of the relevant bit lines (e.g. BLT1 and BLC1) with the conditions for the charge equalization phase for the bit line pairs of two adjacent cell blocks. By virtue of the connection of the bit line ends—open up to this point—by the BL—BL switch pair 10 that is driven simultaneously with the control signal, that adjacent bit line for example of block 2 which is stable at the center level is used for accelerating the discharge curve of the then short-circuited bit line halves in block 1. As a result, the charges are distributed more rapidly on the now short-circuited bit line pair BLT1 and BLC1 and, as shown by the dashed curve in FIG. 3B, the precharge time is significantly shortened. It goes without saying that the above-described switch structure—according to the invention and illustrated in FIGS. 2A and 2B—of the BL—BL switches is provided in all the SA strips between all the blocks of the cell array, so that the precharge performance of the entire chip is improved.

We claim:

1. A dynamic random access memory (DRAM) having a shared sense amplifier organization concept, comprising:

sense amplifiers disposed in sense amplifier strips;

cell arrays subdivided into cell blocks having memory cells and bit lines connected as bit line pairs from two adjacent said cell blocks in each case to a common sense amplifier of said sense amplifiers, said sense amplifiers being disposed between said cell blocks, said bit lines having first ends and second ends connected to said sense amplifiers; and bit line switches disposed in said sense amplifier strips, disposed between said cell blocks, between in each case two adjacent said sense amplifiers, said bit line switches momentarily connecting said first ends, not connected to said sense amplifiers, of two of said bit line pairs from adjacent said cell blocks during a precharge phase of a bit line pair activated directly beforehand, the precharge phase taking place at a start of a charge equalization phase.

2. The DRAM according to claim 1, further comprising a multiplicity of word lines running in said cell blocks of said cell arrays, said word lines intersecting said bit lines substantially perpendicularly and activating said memory cells of said cell blocks.

3. The DRAM according to claim 1, further comprising charge equalization units each connected to one of said bit line pairs in said sense amplifier strips on a right and on a left of each of said sense amplifiers to short-circuit two bit line halves of each of said bit line pairs directly after an activation of a respective cell block to which a respective bit line pair belongs, for a charge equalization of said two bit line halves that are spread during an active phase of said respective cell block.

4. The DRAM according to claim 1, wherein to close each of said bit line switches, each of said bit line switches receives a control signal generated by a logical combination of charge equalization states of this and at least an adjacent cell block.

5. A method for operating a dynamic random access memory having a shared sense amplifier organization concept, the memory having cell arrays subdivided into cell blocks and bit lines connected in as bit line pairs to and extending from two adjacent cell blocks in each case to a common sense amplifier, and sense amplifiers being disposed between the cell blocks, which comprises the steps of:

momentarily interconnecting previously non-connected first ends of the bit line pairs connected to the sense amplifiers lying in two adjacent sense amplifier strips during a precharge phase for a relevant bit line pair, the precharge phase taking place at a start of a charge equalization phase, resulting in a precharge time for the relevant bit line pair being shortened.

6. The method according to claim 5, which further comprises activating the momentary interconnection of the two adjacent bit line pairs by a control signal generated by a logical combination of charge equalization states of the relevant cell block and of an adjacent cell block at a beginning of the charge equalization phase of the relevant cell block and the control signal is fed to a bit line switch pair disposed between the two bit line pairs to be connected.

* * * * *